United States Patent
Nakajima et al.

(10) Patent No.: US 12,521,773 B2
(45) Date of Patent: Jan. 13, 2026

(54) METHOD OF CLEANING ELECTROSTATIC CHUCK AND METHOD OF MANUFACTURING SEMICONDUCTOR DEVICE WHILE EXPOSING ELECTROSTATIC CHUCK TO PLASMA AND INTRODUCING ELECTRON CURRENT

(71) Applicant: Tokyo Electron Limited, Tokyo (JP)

(72) Inventors: Koichi Nakajima, Nirasaki (JP); Satoshi Chida, Oshu (JP); Satoshi Chino, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 664 days.

(21) Appl. No.: 17/906,368

(22) PCT Filed: Mar. 3, 2021

(86) PCT No.: PCT/JP2021/008201
§ 371 (c)(1),
(2) Date: Sep. 15, 2022

(87) PCT Pub. No.: WO2021/187112
PCT Pub. Date: Sep. 23, 2021

(65) Prior Publication Data
US 2023/0173557 A1 Jun. 8, 2023

(30) Foreign Application Priority Data
Mar. 17, 2020 (JP) ................. 2020-046448

(51) Int. Cl.
*B08B 7/00* (2006.01)
*C23C 16/06* (2006.01)
(Continued)

(52) U.S. Cl.
CPC ............ *B08B 7/0035* (2013.01); *C23C 16/06* (2013.01); *C23C 16/4405* (2013.01);
(Continued)

(58) Field of Classification Search
CPC .......... H01J 2237/335; H01L 21/6831; H01L 21/6833; C23C 16/509; C23C 16/4405
See application file for complete search history.

(56) References Cited

U.S. PATENT DOCUMENTS

| | | | |
|---|---|---|---|
| 2002/0069971 A1* | 6/2002 | Kaji | H01J 37/32623 156/345.46 |
| 2012/0006351 A1* | 1/2012 | Jun | H01J 37/32862 134/1.1 |

(Continued)

FOREIGN PATENT DOCUMENTS

| | | | |
|---|---|---|---|
| JP | 2002-280365 A | | 9/2002 |
| JP | 2002270682 A | * | 9/2002 |

(Continued)

*Primary Examiner* — William B Partridge
*Assistant Examiner* — Dmitri Mihaliov
(74) *Attorney, Agent, or Firm* — Armstrong Teasdale LLP

(57) ABSTRACT

A cleaning method according to one aspect of the present disclosure which cleans an electrostatic chuck includes exposing the electrostatic chuck to plasma and maintaining a relationship between a potential of the electrostatic chuck and a potential of the plasma such that electron current is introduced from the plasma toward the electrostatic chuck.

11 Claims, 2 Drawing Sheets

(51) Int. Cl.
*C23C 16/44* (2006.01)
*C23C 16/458* (2006.01)
*C23C 16/509* (2006.01)
*H01J 37/32* (2006.01)
*H01L 21/3205* (2006.01)
*H01L 21/683* (2006.01)

(52) U.S. Cl.
CPC ........ *C23C 16/4586* (2013.01); *C23C 16/509* (2013.01); *H01J 37/32082* (2013.01); *H01J 37/32715* (2013.01); *H01L 21/32051* (2013.01); *H01L 21/6831* (2013.01); *H01J 2237/2007* (2013.01); *H01J 2237/3321* (2013.01); *H01J 2237/335* (2013.01)

(56) References Cited

U.S. PATENT DOCUMENTS

| | | | |
|---|---|---|---|
| 2019/0035666 A1* | 1/2019 | Lim | H01L 21/6831 |
| 2019/0066982 A1* | 2/2019 | Sato | H01L 21/67253 |
| 2019/0385815 A1* | 12/2019 | Iwashita | H01J 37/32568 |

FOREIGN PATENT DOCUMENTS

| | | |
|---|---|---|
| JP | 2004-095909 A | 3/2004 |
| JP | 2017-188648 A | 10/2017 |

* cited by examiner

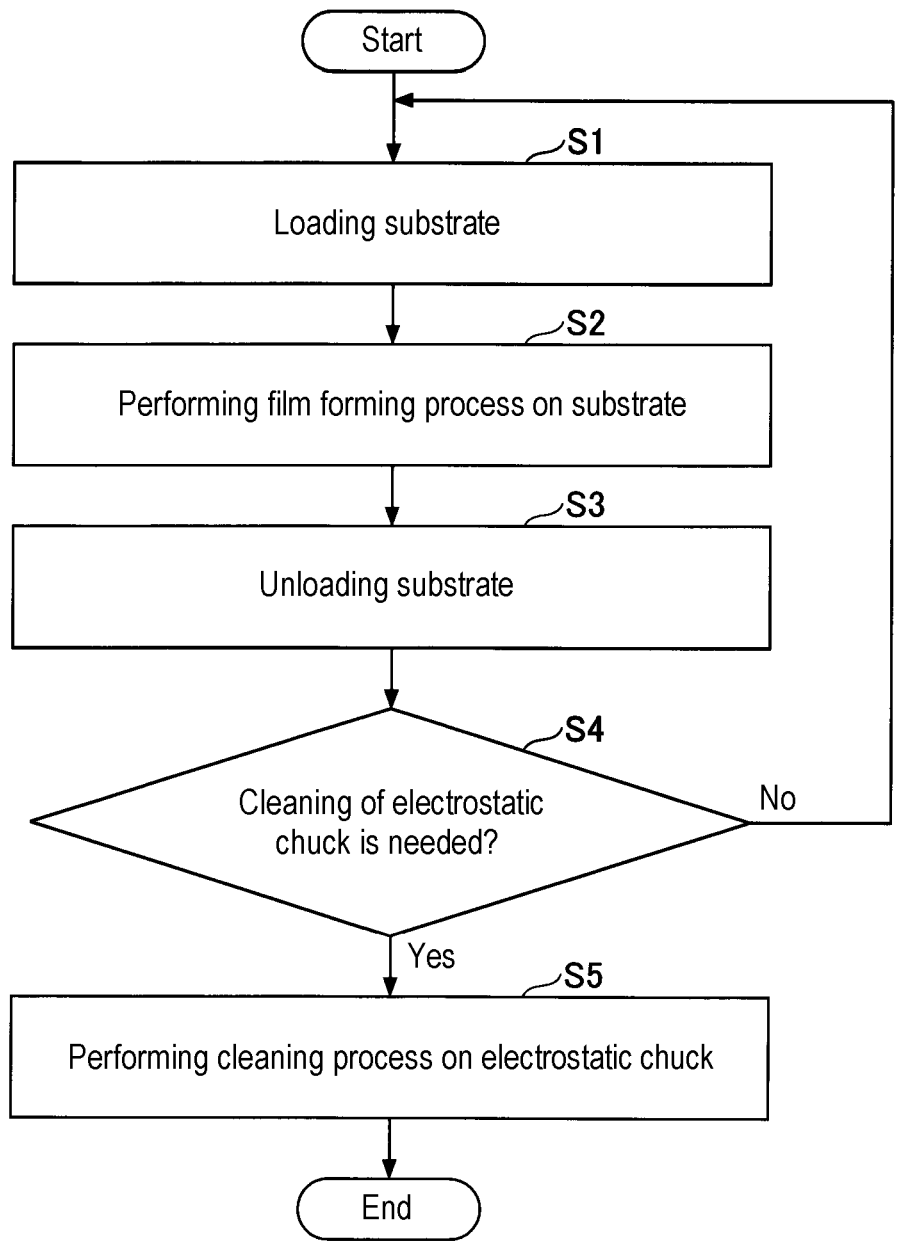

METHOD OF CLEANING ELECTROSTATIC CHUCK AND METHOD OF MANUFACTURING SEMICONDUCTOR DEVICE WHILE EXPOSING ELECTROSTATIC CHUCK TO PLASMA AND INTRODUCING ELECTRON CURRENT

CROSS-REFERENCE TO RELATED APPLICATIONS

The present application is a U.S. National Stage Entry of International Patent Application No. PCT/JP2021/008201, filed Mar. 3, 2021, which claims the benefit of priority to Japanese Patent Application No. 2020-046448, filed Mar. 17, 2020, each of which is hereby incorporated herein by reference in its entirety.

TECHNICAL FIELD

The present disclosure relates to a cleaning method and a method of manufacturing a semiconductor device.

BACKGROUND

A technique of plasma-etching contaminants adhered onto an electrostatic chuck by colliding argon ions generated by plasma discharge against the electrostatic chuck has been known (see, for example, Patent Document 1).

PRIOR ART DOCUMENT

Patent Document

Patent Document 1: Japanese Laid-Open Publication No. 2002-280365

The present disclosure provides a technique capable of removing deposits adhered onto an electrostatic chuck while preventing damage to the surface of the electrostatic chuck.

SUMMARY

According to one embodiment of the present disclosure, a cleaning method of cleaning an electrostatic chuck includes exposing the electrostatic chuck to plasma, and maintaining a relationship between a potential of the electrostatic chuck and a potential of the plasma such that an electron current is introduced from the plasma toward the electrostatic chuck.

According to the present disclosure, it is possible to remove deposits adhered onto an electrostatic chuck while preventing damage to the surface of the electrostatic chuck.

BRIEF DESCRIPTION OF DRAWINGS

FIG. 2 is a flowchart illustrating an example of a method of manufacturing a semiconductor device according to an embodiment.

DETAILED DESCRIPTION

Figure 1:
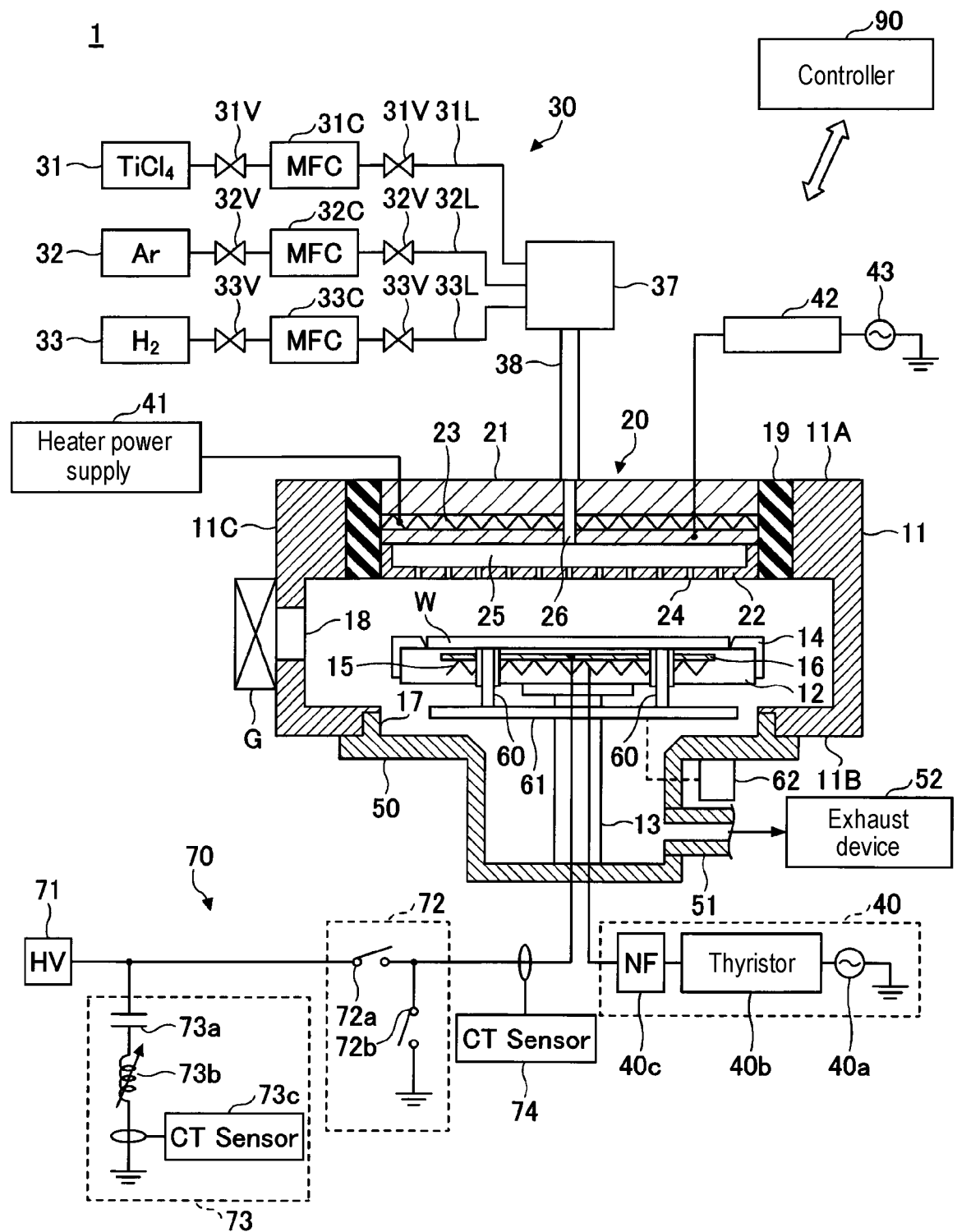
FIG. 1 is a schematic diagram showing an example of a film forming apparatus according to an embodiment.

Hereinafter, non-limiting exemplary embodiments of the present disclosure will be described with reference to the accompanying drawings. In all the accompanying drawings, the same or corresponding members or components will be denoted by the same or corresponding reference numerals, and redundant explanations will be omitted.

[Film Forming Apparatus]

An example of a film forming apparatus according to an embodiment will be described with reference to FIG. 1. FIG. 1 is a schematic diagram showing the example of the film forming apparatus according to the embodiment. In the following embodiment, a case where the film forming apparatus is a plasma chemical vapor deposition (CVD) apparatus that forms a titanium (Ti) film on a substrate by plasma enhanced CVD (PECVD) will be described by way of example.

The film forming apparatus 1 includes a processing chamber 11 configured by a substantially cylindrical processing container which is hermetically sealed. A stage 12, which is configured to horizontally attract and hold a semiconductor wafer (hereinafter referred to as "wafer W") as an example of a substrate, is arranged in the processing chamber 11, and is supported by a substantially cylindrical support member 13 provided below the center of the stage 12.

The stage 12 is made of a conductive ceramic such as an aluminum nitride (AlN). A guide ring 14 is provided on an outer edge portion of the stage 12 to guide the wafer W.

A heater 15 is embedded in the stage 12. The heater 15 heats the wafer W to a predetermined temperature upon receiving power from a heater power supply 40. In the present embodiment, the heater power supply 40 includes an alternating current (AC) power supply 40a, a thyristor 40b, and a noise filter (NF) 40c.

A lower electrode 16 is embedded in the stage 12 above the heater 15. A chuck control mechanism 70 described later is connected to the lower electrode 16. The stage 12 and the lower electrode 16 function as an electrostatic chuck. In the present embodiment, the electrostatic chuck is of a Johnson-Rahbek (JR) type.

A shower head 20 is provided in a ceiling wall 11A of the processing chamber 11 via an insulating member 19. The shower head 20 includes an upper base member 21 and a shower plate 22 provided below the base member 21. A heater 23 is embedded in the base member 21 to heat the shower head 20. The heater 23 heats the shower head 20 to a predetermined temperature upon receiving power from a heater power supply 41.

The shower plate 22 has a plurality of discharge holes 24 formed therethrough to discharge a gas into the processing chamber 11. Each discharge hole 24 communicates with a gas diffusion space 25 defined between the base member 21 and the shower plate 22. A gas introduction port 26 is provided in a central portion of the base member 21 to supply process gases to the gas diffusion space 25. The gas introduction port 26 is connected to a mixed-gas supply line 38 of a gas supply 30 described later.

The gas supply 30 includes a $TiCl_4$ gas source 31 that supplies a $TiCl_4$ gas as a Ti compound gas, an Ar gas source 32 that supplies an Ar gas, and an $H_2$ gas source 33 that supplies an $H_2$ gas as a reducing gas.

A $TiCl_4$ gas supply line 31L is connected to the $TiCl_4$ gas source 31, an Ar gas supply line 32L is connected to the Ar gas source 32, and an $H_2$ gas supply line 33L is connected to the $H_2$ gas source 33. Each of the gas supply lines 31L to 33L is provided with a mass flow controller (MFC) 31C to 33C and two valves 31V to 33V with the mass flow controller 31C to 33C sandwiched therebetween.

A gas mixer 37 functions to mix the aforementioned process gases and supply them to the shower head 20. The $TiCl_4$ gas source 31, the Ar gas source 32, and the $H_2$ gas source 33 are connected to the gas inlet side of the gas mixer 37 via the respective gas supply lines 31L to 33L. The shower head 20 is connected to the gas outlet side of the gas mixer 37 via the mixed-gas supply line 38.

During a process, one kind of gas or a mixed gas of a plurality of gases, selected from among the $TiCl_4$ gas, the Ar gas and the $H_2$ gas, is introduced from the discharge holes 24 into the processing chamber 11 by way of the gas introduction port 26 and the gas diffusion space 25 of the shower head 20.

As described above, in the present embodiment, the shower head 20 is configured of a so-called pre-mix type in which the process gases are mixed in advance and supplied into the processing chamber 11, but may be configured of a post-mix type in which each process gas is independently supplied into the processing chamber 11.

A radio frequency power supply 43 is connected to the shower head 20 via a matcher 42. Plasma is generated between the shower head 20 and the lower electrode 16 by supplying radio frequency power of, for example, 450 kHz from the radio frequency power supply 43 to the shower head 20 in a state where the process gases have been supplied into the processing chamber 11. Thus, the shower head 20 functions as an upper electrode arranged to face the lower electrode. The distance between the upper surface of the stage 12 and the lower surface of the shower plate 22 (distance between a pair of electrodes) may be 80 mm or less from the viewpoint of being able to efficiently draw electrons to the side of the electrostatic chuck in a cleaning process described later. In addition, the radio frequency power is not limited to 450 kHz, and may appropriately utilize, for example, 2 MHz, 13.56 MHz, 27 MHz, 60 MHz, 100 MHz, or the like.

A circular opening 17 is formed in a central portion of a bottom wall 11B of the processing chamber 11, and an exhaust chamber 50 is provided in the bottom wall 11B to protrude downward so as to cover the opening 17. An exhaust pipe 51 is connected to the side surface of the exhaust chamber 50, and an exhaust device 52 is connected to the exhaust pipe 51. The exhaust device 52 decompresses the inside of the processing chamber 11 to a predetermined vacuum pressure.

The stage 12 is provided with a plurality of (e.g., three) lifting pins 60 for supporting and moving the wafer W up and down, and the lifting pins 60 are provided to be able to protrude to and retract with respect to the surface of the stage 12. The lifting pins 60 are fixed to a support plate 61. The lifting pins 60 are raised and lowered by a drive mechanism 62 such as an air cylinder via the support plate 61. A sidewall 11C of the processing chamber 11 is provided with a loading/unloading port 18, through which the wafer W is loaded and unloaded, and a gate valve G that opens and closes the loading/unloading port 18.

The lifting pins 60 are raised and lowered when loading and unloading the wafer W into and out of the processing chamber 11. Specifically, the lifting pins 60 are raised when loading the wafer W into the processing chamber 11. Then, the wafer W is loaded from the loading/unloading port 18 and placed on the lifting pins 60 by a transfer arm (not shown). Subsequently, the lifting pins 60 are lowered to place the wafer W on the stage 12. Further, the lifting pins 60 are raised to lift the wafer W when unloading the wafer W from the processing chamber 11. Then, the wafer W is held and unloaded from the loading/unloading port 18 by the transfer arm (not shown).

The film forming apparatus 1 includes a controller 90. The controller 90 controls the operation of each component of the film forming apparatus 1. The controller 90 is, for example, a computer. The controller 90 includes a program, a memory, a data processor including a CPU, and the like. The program incorporates instructions (each step) to send a control signal from the controller 90 to each component of the film forming apparatus 1 and to execute a method of cleaning the electrostatic chuck described later. The program is installed in the controller 90 by being stored in a storage medium such as a flash memory, a hard disk, or an optical disk, for example.

[Chuck Control Mechanism]

The chuck control mechanism 70 is electrically connected to the lower electrode 16. The chuck control mechanism 70 includes a power supply 71, a grounding box 72, a variable impedance device 73, and a current sensor 74.

The power supply 71 applies an anode voltage to the stage 12 via the lower electrode 16. In the present embodiment, the power supply 71 is a high voltage (HV) power supply, and applies a high voltage of, for example, 400 V to 600 V to the stage 12 via the lower electrode 16. By setting the anode voltage to, for example, 400 V to 600 V, a relationship between the potential of the stage 12 and the potential of the plasma can be maintained such that an electron current is introduced from the plasma toward the stage 12. Further, the power supply 71 may include an RF filter (not shown) that cuts off radio-frequency power introduced into the power supply 71 from the stage 12 side.

The grounding box 72 is provided between the power supply 71 and the lower electrode 16. The grounding box 72 is configured to enable switching between the grounding state of the lower electrode 16 and the non-grounding state of the lower electrode 16. In the present embodiment, the grounding box 72 includes a switch 72a and a switch 72b. The switch 72a performs switching of the electrical connection between the power supply 71 and the lower electrode 16. The power supply 71 and the lower electrode 16 are electrically connected when the switch 72a is turned on, and the electrical connection between the power supply 71 and the lower electrode 16 is cut off when the switch 72a is turned off. The switch 72b performs switching of the grounding state of the lower electrode 16. The lower electrode 16 is grounded when the switch 72b is turned on.

The variable impedance device 73 is provided between the power supply 71 and the grounding box 72. The variable impedance device 73 adjusts the impedance on the stage 12 side. In the present embodiment, the variable impedance device 73 includes a capacitor 73a and a variable coil 73b which are connected in series, and adjusts the impedance on the stage 12 side by adjusting the inductance of the variable coil 73b. Further, the variable impedance device 73 includes a current sensor 73c. The current sensor 73c is, for example, an AC sensor such as a current transformer (CT) type current sensor.

The current sensor 74 detects a current flowing from the lower electrode 16 toward the power supply 71. In other words, the current sensor 74 detects an electron current introduced from a plasma space toward the electrostatic chuck. The current sensor 74 is, for example, an AC sensor such as a CT-type current sensor.

[Method of Manufacturing Semiconductor Device]

An example of a method of manufacturing a semiconductor device including a cleaning method according to an embodiment will be described with reference to FIG. 2. FIG. 2 is a flowchart illustrating an example of a method of manufacturing a semiconductor device according to an embodiment. Further, the following description is based on the assumption that the inside of the processing chamber 11 is brought into a vacuum atmosphere by the exhaust device 52 at the start of the method of manufacturing the semiconductor device.

First, the controller 90 loads the wafer W into the processing chamber 11 (step S1). In the present embodiment, the controller 90 loads the wafer W into the processing chamber 11, and transfers the wafer W to/from the lifting pins 60 to place it on the stage 12 by the transfer arm (not shown). Subsequently, the controller 90 closes the gate valve G. Subsequently, the controller 90 controls the exhaust device 52 to decompress the inside of the processing chamber 11 to a predetermined pressure. Further, the controller 90 controls the AC power supply 40a and the heater power supply 41 to heat the stage 12 and the shower head 20 to a predetermined temperature.

Subsequently, the controller 90 performs a film forming process on the wafer W attracted to and held on the stage 12 (step S2). In the present embodiment, the controller 90 controls the gas supply 30 to supply the $TiCl_4$ gas and the $H_2$ gas into the processing chamber 11. Further, the controller 90 controls the power supply 71 and the grounding box 72 to apply a voltage to the lower electrode 16 and also to supply radio frequency power of a predetermined frequency to the shower head 20 by the radio frequency power supply 43. Accordingly, the wafer W is attracted to and held on the stage 12 (electrostatic chuck), a plasma is generated between the electrostatic chuck and the shower head 20, and a Ti film is formed on the wafer W by a reaction of the $TiCl_4$ gas and the $H_2$ gas.

When the film forming process ends, the controller 90 unloads the wafer W with the Ti film formed thereon from the processing chamber 11 (step S3). In the present embodiment, the controller 90 controls the grounding box 72 to ground the lower electrode 16, thereby releasing the attraction of the wafer W to the stage 12. Subsequently, the controller 90 opens the gate valve G. Subsequently, the wafer W inside the processing chamber 11 is unloaded by the transfer arm (not shown).

After unloading the wafer W from the inside of the processing chamber 11, the controller 90 determines whether or not cleaning of the electrostatic chuck is needed (step S4). Whether or not the cleaning of the electrostatic chuck is needed is determined based on, for example, the number of times the film forming process is performed and the time required therefor.

If it is determined in step S4 that the cleaning of the electrostatic chuck is not needed, the controller 90 returns the process to step S1. That is, the controller 90 loads the wafer W to be processed next into the processing chamber 11 and performs the film forming process without performing a cleaning process of the electrostatic chuck.

On the other hand, if it is determined in step S4 that the cleaning of the electrostatic chuck is needed, the controller 90 performs a cleaning process (cleaning method) on the electrostatic chuck (step S5). In the cleaning process, the electrostatic chuck is cleaned by exposing the electrostatic chuck to the plasma with no wafer W on the electrostatic chuck and maintaining a relationship between the potential of the electrostatic chuck and the potential of the plasma such that an electron current is introduced from the plasma toward the electrostatic chuck. In the present embodiment, the controller 90 turns the switch 72a on and the switch 72b off, and controls the power supply 71 to apply an anode voltage of, for example, 400 V to 600 V to the lower electrode 16. Further, the controller 90 controls the gas supply 30 to supply the Ar gas into the processing chamber 11 and also controls the radio frequency power supply 43 to supply radio frequency power of, for example, 450 kHz to the shower head 20, thereby generating plasma. Further, the controller 90 controls the variable impedance device 73 to adjust the impedance on the side of the electrostatic chuck, thereby stabilizing the plasma generated between the pair of electrodes arranged to face each other.

As described above, by maintaining the relationship between the potential of the electrostatic chuck and the potential of the plasma such that the electron current is introduced from the plasma toward the electrostatic chuck, the surface of the electrostatic chuck is positively (+) charged, and therefore, electrons contained in the plasma are drawn to the surface of the electrostatic chuck. That is, the electron current is introduced from the plasma toward the electrostatic chuck (lower electrode 16). Accordingly, collision of electrons occurs on the surface of the electrostatic chuck, and deposits adhered to the electrostatic chuck are removed. At this time, since the surface of the electrostatic chuck is positively charged, it is difficult for high-energy positive ions (e.g., Ar+) to collide with the surface of the electrostatic chuck. In this way, it is possible to selectively collide low-energy electrons with the surface of the electrostatic chuck while preventing the collision of high-energy positive ions with the surface of the electrostatic chuck. As a result, it is possible to remove deposits adhered onto the electrostatic chuck while preventing damage to the surface of the electrostatic chuck.

When the cleaning process ends, the controller 90 ends the process.

As described above, according to the embodiment, the electrostatic chuck is exposed to plasma, and the relationship between the potential of the electrostatic chuck and the potential of the plasma is maintained such that the electron current is introduced from the plasma to the electrostatic chuck. Accordingly, electrons are drawn from the plasma space to the side of the electrostatic chuck, and the drawn electrons collide with the surface of the electrostatic chuck, whereby it is possible to remove deposits adhered onto the electrostatic chuck. In this way, according to the embodiment, since the collision of electrons on the surface of the electrostatic chuck is mainly used, less damage to the surface of the electrostatic chuck is achieved compared to using the collision of positive ions (e.g., Ar+). For example, when utilizing the collision of positive ions, the outermost surface of a dielectric layer (e.g., sintering agent) of the electrostatic chuck is likely to be etched by the impact of positive ions, thus causing generation of impurities such as particles.

Further, according to the embodiment, since deposits adhered onto the electrostatic chuck may be removed using the plasma, it is possible to reduce the frequency of regeneration (repair) of the electrostatic chuck performed after removing the electrostatic chuck from the film forming apparatus 1, which results in improved productivity.

Further, according to the embodiment, plasma is generated in a relatively narrow space in which the distance between the pair of electrodes is 80 mm or less, and the cleaning process is performed on the electrostatic chuck by the plasma. Accordingly, electrons may be efficiently drawn to the side of the electrostatic chuck, so that the ability to remove deposits on the electrostatic chuck is enhanced.

Further, according to the embodiment, the impedance of the electrostatic chuck may be adjusted using the variable impedance device connected to the electrostatic chuck. Accordingly, since the impedance on the side of the electrostatic chuck may be adjusted even when the anode voltage applied to the lower electrode 16 is changed, it is possible to generate a stable plasma.

EXAMPLE

In the example, in the above-described film forming apparatus 1, the above-described cleaning process was performed on the electrostatic chuck having deposits adhered to the surface thereof. Further, the surface resistance of the electrostatic chuck was measured before and after the cleaning process. In addition, the conditions of the cleaning process and the measurement conditions of the surface resistance are as follows.

(Conditions of Cleaning Process)
  Distance between the pair of electrodes: 10 mm to 50 mm
  Output of the radio frequency power supply 43: 450 kHz, 500 W
  Output of the power supply 71: 500 V
  Pressure in the processing chamber 11: 5 Torr (667 Pa)
  Process time: 60 seconds×10 cycles (Measurement Conditions of Surface Resistance)
  Applied voltage: 1,000 V The following Table 1 shows results of comparing surface resistances of the electrostatic chuck before and after the cleaning process. In addition, in Table 1, the measurement positions mean different positions within the plane of the electrostatic chuck.

TABLE 1

| Measurement Position | Before Cleaning Process | After Cleaning Process |
| --- | --- | --- |
| 1 | 77.9M | 2 T |
| 2 | 44.0M | 2 T |
| 3 | 25.8M | 2 T |
| 4 | 9.3M | 2 T |
| 5 | 2.8M | 2 T |
| 6 | 8.15M | 2 T |
| 7 | 24.6M | 2 T |
| 8 | 65.7M | 2 T |
| 9 | 42.9M | 2 T |
| 10 | 22.3M | 2 T |
| 11 | 44.0M | 2 T |
| 12 | 13.4M | 2 T |
| 13 | 18.0M | 2 T |
| 14 | 23.9M | 2 T |
| 15 | 39.5M | 2 T |
| 16 | 9.8M | 2 T |
| 17 | 10.6M | 2 T |
| 18 | 132M | 2 T |
| 19 | 5.71M | 2 T |

As shown in Table 1, it can be seen that the surface resistance of the electrostatic chuck before performing the cleaning process is 2.8 MΩ to 132 MΩ, while the surface resistance of the electrostatic chuck after performing the cleaning process is the upper limit of measurement (2 TΩ) or more. From this result, it is considered that, by performing the above-described cleaning process on the electrostatic chuck, deposits on the electrostatic chuck were removed and the surface resistance of the electrostatic chuck was increased.

The embodiments disclosed herein should be considered to be exemplary and not limitative in all respects. The above-described embodiments may be omitted, replaced, or modified in various embodiments without departing from the scope of the appended claims and their gist.

This international application claims priority to Japanese Patent Application No. 2020-046448 filed on Mar. 17, 2020, which is incorporated herein by reference in its entirety.

EXPLANATION OF REFERENCE NUMERALS

12: stage, 16: lower electrode, 20: shower head, 73: variable impedance device, W: wafer

What is claimed is:

1. A cleaning method of cleaning an electrostatic chuck comprising:
  exposing the electrostatic chuck to plasma and maintaining a relationship between a potential of the electrostatic chuck and a potential of the plasma such that an electron current is introduced from the plasma toward the electrostatic chuck,
  wherein the plasma is formed between a pair of electrodes arranged to face each other,
  wherein the pair of electrodes include a first electrode inside the electrostatic chuck and a second electrode facing the electrostatic chuck,
  wherein a distance between the first electrode and the second electrode is 80 mm or less, and
  wherein the exposing includes applying an anode voltage of 400 V to 600 V to the first electrode.

2. The cleaning method of claim 1, wherein the electrostatic chuck is of a Johnson-Rahbek type.

3. The cleaning method of claim 2, wherein radio frequency power is applied to the first electrode.

4. The cleaning method of claim 3, wherein the cleaning method is performed without a substrate on the electrostatic chuck.

5. The cleaning method of claim 4, wherein the electrostatic chuck is connected to a variable impedance device configured to adjust an impedance.

6. The cleaning method of claim 5, wherein the anode voltage is controlled based on the electron current introduced toward the electrostatic chuck.

7. The cleaning method of claim 1, wherein radio frequency power is applied to the first electrode.

8. The cleaning method of claim 1, wherein the cleaning method is performed without a substrate on the electrostatic chuck.

9. The cleaning method of claim 1, wherein the electrostatic chuck is connected to a variable impedance device configured to adjust an impedance.

10. The cleaning method of claim 1, wherein the anode voltage is controlled based on the electron current introduced toward the electrostatic chuck.

11. A method of manufacturing a semiconductor device, the method comprising:
  performing film formation while attracting and holding a substrate on an electrostatic chuck; and
  exposing the electrostatic chuck to plasma without a substrate on the electrostatic chuck to clean the electrostatic chuck,
  wherein the exposing includes maintaining a relationship between a potential of the electrostatic chuck and a potential of the plasma such that an electron current is introduced from the plasma toward the electrostatic chuck,
  wherein the plasma is formed between a pair of electrodes arranged to face each other,
  wherein the pair of electrodes include a first electrode inside the electrostatic chuck and a second electrode facing the electrostatic chuck,
  wherein a distance between the first electrode and the second electrode is 80 mm or less, and wherein the exposing includes applying an anode voltage of 400 V to 600 V to the first electrode.

\* \* \* \* \*